United States Patent
Cheng et al.

(10) Patent No.: US 12,055,964 B2
(45) Date of Patent: Aug. 6, 2024

(54) MULTI-LOOP POWER CONVERTER AND MULTI-LOOP ERROR AMPLIFIER CIRCUIT AND CONTROL METHOD THEREOF

(71) Applicant: Richtek Technology Corporation, Zhubei (TW)

(72) Inventors: Hung-Yu Cheng, Taipei (TW); Keng-Hong Chu, Hsinchu (TW); Li-Chen Cheng, Taipei (TW); Tsung-Han Yu, Hsinchu (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 0 days.

(21) Appl. No.: 18/299,985

(22) Filed: Apr. 13, 2023

(65) Prior Publication Data

US 2023/0359232 A1   Nov. 9, 2023

(30) Foreign Application Priority Data

May 4, 2022   (TW) .................. 111116866

(51) Int. Cl.
*H03F 3/45* (2006.01)
*G05F 1/56* (2006.01)
*G05F 1/565* (2006.01)

(52) U.S. Cl.
CPC .............. *G05F 1/565* (2013.01); *G05F 1/561* (2013.01); *H03F 3/45273* (2013.01); *H03F 3/45475* (2013.01); *H03F 2200/261* (2013.01)

(58) Field of Classification Search
None
See application file for complete search history.

(56) References Cited

U.S. PATENT DOCUMENTS

| | | | |
|---|---|---|---|
| 7,206,210 B2 * | 4/2007 | Harnett | H02M 3/156 363/80 |
| 7,564,219 B2 * | 7/2009 | Choi | H02J 7/00712 320/128 |
| 7,705,563 B2 * | 4/2010 | Ibaraki | H02J 7/00 320/128 |
| 8,269,468 B2 * | 9/2012 | Ju | H02J 7/00712 320/152 |
| 9,195,252 B1 * | 11/2015 | Tanase | G05F 3/02 |
| 2022/0069711 A1 | 3/2022 | Karri et al. | |

* cited by examiner

*Primary Examiner* — Thomas J. Hiltunen
(74) *Attorney, Agent, or Firm* — Tung & Associates

(57) ABSTRACT

A multi-loop error amplifier circuit for generating an error amplification signal includes: a first operational transconductance amplifier (OTA) including a first current output stage which generates a first transconductance amplification current in a predetermined current direction according to a first voltage difference between a positive terminal and a negative input terminal of the first OTA; a second OTA including a second current output stage which generates a second transconductance amplification current in the predetermined current direction according to a second voltage difference between a positive terminal and a negative input terminal of the second OTA. The first and the second current output stages are coupled in series to generate a first error output current. The error amplification signal is generated according to the first error output current which is equal to the smaller one of the first and the second transconductance amplification currents.

20 Claims, 11 Drawing Sheets

MULTI-LOOP POWER CONVERTER AND MULTI-LOOP ERROR AMPLIFIER CIRCUIT AND CONTROL METHOD THEREOF

CROSS REFERENCE

The present invention claims priority to TW 111116866, filed on May 4, 2022.

BACKGROUND OF THE INVENTION

Field of Invention

The present invention relates to a multi-loop power converter, in particular to a multi-loop power converter that can avoid the problem of cross modulation of different loops in the switching process. This invention also relates to a multi-loop error amplifier circuit and a control method for a multi-loop power converter.

Description of Related Art

FIG. 1A shows a schematic diagram of a multi-loop error amplifier circuit (multi-loop error amplifier circuit 1000) of the prior art. The multi-loop error amplifier circuit 1000 includes plural error amplifiers for multi-loop feedback control, wherein the output terminals of the error amplifier 11, the error amplifier 12 and the error amplifier 13 of the multi-loop error amplifier circuit 1000 are each coupled to a diode and connected in parallel, to generate an error amplification signal EAO1 by multi-loop feedback control. The operations of the error amplifier 12 and the error amplifier 13 are described below as examples.

For example, when the multi-loop error amplifier circuit 1000 is used in a Battery Management System (BMS), the error amplifier 12 generates a first signal S1 according to the difference between the battery voltage Vbat and the reference voltage Vref, and the error amplifier 13 generates a second signal S2 according to the difference between the charging current Ichg and the reference current Iref. When the voltage of the first signal S1 is greater than the voltage of the second signal S2, the diode 14 is turned ON, and the diode 15 is turned OFF, so the voltage of node N1 is equal to the voltage of the first signal S1, and the voltage of the node N2 is clamped to the voltage of the first signal S1; in this case, the error amplification signal EAO1 is generated according to the voltage of the first signal S1. In other words, in this case, the multi-loop error amplifier circuit 1000 is feedback-controlled by the error amplifier 12.

FIG. 1B shows the current/voltage versus time relationship for the Battery Management System (BMS), which corresponds to the prior art in FIG. 1A. The error amplifier 12 is for use to feedback-control the battery management system to operate in Constant Voltage (CV) charging mode and the error amplifier 13 is for use to feedback-control the battery management system to operate in Constant Current (CC) charging mode. As shown in FIG. 1B, during time period μl, the voltage of the second signal S2 is greater than the voltage of the first signal S1, so the loop of the error amplifier 13 dominates to charge the battery by Constant Current mode. When the battery voltage reaches a threshold, the voltage of the first signal S1 becomes greater than the voltage of the second signal S2, to thereby the loop of the error amplifier 12 dominates to charge the battery by Constant Voltage mode.

However, in the prior art, the multi-loop error amplifiers are arranged in parallel connection configuration, and since the bandwidths and open loop transfer functions of the loops are not identical, a cross-modulation problem arises during the transition of the two loops. That is, as shown in FIG. 1B, the time period T2 is the transition period between loop of the error amplifier 12 and the loop of the error amplifier 13, and during this period, the two loops interact with each other to jeopardize the transition, and the operations of both loops are inaccurate, deteriorating the charging efficiency.

Compared with the prior art, the serial configuration of the present invention can solve the multi-loop cross-modulation problem, so that transition between different loops can be achieved instantly to remove the transition period. Moreover, the multi-loop error amplifier circuit of the invention can be used in different systems to effectively solve various multi-loop interdependence problems.

SUMMARY OF THE INVENTION

In one perspective, the present invention provides a multi-loop error amplifier circuit configured to generate an error amplification signal. The multi-loop error amplifier circuit comprises: a first transconductance amplifier comprising a first current output stage, the first current output stage being configure to generate a first transconductance amplification current in a predetermined current direction according to a first voltage difference between a positive input terminal and a negative input terminal of the first transconductance amplifier, wherein the first transconductance amplification current is proportional to the first voltage difference; and a second transconductance amplifier comprising a second current output stage, the second current output stage being configure to generate a second transconductance amplification current in the predetermined current direction according to a second voltage difference between a positive input terminal and a negative input terminal of the second transconductance amplifier, wherein the second transconductance amplification current is proportional to the second voltage difference; wherein the first current output stage is in series connection with the second current output stage to generate a first error output current, whereby the error amplification signal is generated in accordance with the first error output current, wherein the first error output current is equal to a smaller one of the first transconductance amplification current and the second transconductance amplification current.

In one preferable embodiment, the first current output stage includes a first output transistor, and the second current output stage includes a second output transistor, wherein the first output transistor and the second output transistor are MOSFETs (Metal-Oxide-Semiconductor Field Effect Transistors) of the same conductivity type, wherein the first output transistor and the second output transistor are configured to generate the first transconductance amplification current and the second transconductance amplification current according to the first voltage difference and the second voltage difference, respectively, wherein the first output transistor is connected in series with the second output transistor to generate the first error output current; wherein, when the first transconductance amplification current is smaller than the second transconductance amplification current, the first output transistor outputs the first transconductance amplification current as the first error output current, and clamps the current of the second output transistor to the first transconductance amplification current; and wherein, when the second transconductance amplification current is smaller than the first transconductance amplification current, the second output transistor outputs the second transconductance amplification current as the first error output current and clamps the current of the first output transistor to the second transconductance amplification current.

In one preferable embodiment, the first current output stage further includes a first current mirror, the first current mirror including the first output transistor, wherein the first output transistor mirrors a first pre-transconductance current to generate the first transconductance amplification current, and/or, the second current output stage further includes a second current mirror, the second current mirror including the second output transistor, wherein the second output transistor mirrors a second pre-transconductance current to generate the second transconductance amplification current, wherein the first pre-transconductance current is proportional to a product of the first voltage difference and a predetermined first transconductance value, and the second pre-transconductance current is proportional to a product of the second voltage difference and a predetermined second transconductance value.

In one preferable embodiment, the first current output stage further includes a cascode transistor which is coupled to the second current mirror to assist matching of the transistors of the second current mirror, so as to ensure a mirror accuracy of the second current mirror.

In one preferable embodiment, when the first transconductance amplification current is smaller than the second transconductance amplification current, the first output transistor operates in a saturation region and the second output transistor operates in a linear region; wherein when the second transconductance amplification current is smaller than the first transconductance amplification current, the second output transistor operates in a saturation region and the first output transistor operates in a linear region.

In one preferable embodiment, the multi-loop error amplifier circuit further includes: a third current mirror for mirroring the first error output current to generate a first comparison current in a current output branch of the third current mirror; and a third transconductance amplifier including a third current output stage, wherein the third current output stage generates a third transconductance amplification current in the predetermined current direction according to a third voltage difference between a positive input terminal and a negative input terminal of the third transconductance amplifier, wherein the third transconductance amplification current is proportional to the third voltage difference; wherein the current output branch of the third current mirror is connected in series with another current output branch to generate a gross output current, wherein the other current output branch is configured to generate a second comparison current according to the third transconductance amplification current; wherein when the first comparison current is smaller than the second comparison current, the current output branch of the third current mirror generates the first comparison current as the gross output current and clamps the current of the other current output branch at the first comparison current; wherein when the second comparison current is smaller than the first comparison current, the other current output branch generates the second comparison current as the gross output current and clamp the current generated by the third current mirror to the second comparison current; wherein the gross output current is equal to a smallest one of the first transconductance amplification current, the second transconductance amplification current, and the second comparison current; wherein the error amplification signal is generated according to the gross output current.

In one preferable embodiment, the multi-loop error amplifier circuit further includes: a fourth transconductance amplifier including a fourth current output stage, wherein the fourth current output stage generates a fourth transconductance amplification current in the predetermined current direction according to a fourth voltage difference between a positive input terminal and a negative input terminal of the fourth transconductance amplifier, wherein the fourth transconductance amplification current is proportional to the fourth voltage difference; wherein the third current output stage is connected in series with the fourth current output stage to generate a second error output current, wherein the second error output current is equal to a smaller one of the third transconductance amplification current and the fourth transconductance amplification current; and a fourth current mirror for mirroring the second error output current to generate the second comparison current in the other current output branch; wherein when the first comparison current is smaller than the second comparison current, the current output branch of the third current mirror generates the first comparison current as the gross output current and clamps the current generated by the fourth current mirror at the first comparison current; wherein when the second comparison current is smaller than the first comparison current, the other current output branch of the fourth current mirror generates the second comparison current as the gross output current and clamp the current generated by the third current mirror to the second comparison current; wherein the gross output current is equal to a smallest one of the first transconductance amplification current, the second transconductance amplification current, the third transconductance amplification current and the fourth transconductance amplification current.

In one preferable embodiment, the first current output stage further includes a third output transistor, and the second current output stage further includes a fourth output transistor, wherein the third output transistor and the first output transistor are MOS transistors of complementary conductivity types, and the fourth output transistor and the second output transistor are MOS transistors of complementary conductivity types; wherein the first output transistor and the third output transistor are configured to generate the first transconductance amplification current in push-pull manner according to the first voltage difference, and the second output transistor and the fourth output transistor are configured to generate the second transconductance amplification current in push-pull manner according to the second voltage difference; wherein the third output transistor is coupled in parallel with the fourth output transistor, thereby generating the first error output current in push-pull manner.

In one preferable embodiment, the first transconductance amplifier further includes a first preamplifier, wherein an output terminal of the first preamplifier is coupled to the first current output stage, wherein the first preamplifier is configured to generate a first pre-amplification signal at the output terminal of the first preamplifier according to the first voltage difference, and wherein the first output transistor is configured to generate the first transconductance amplification current according to the first pre-amplification signal; the second transconductance amplifier further includes a second preamplifier, wherein an output terminal of the second preamplifier is coupled to the second current output stage, wherein the second preamplifier is configured to generate a second pre-amplification signal at the output terminal of the second preamplifier according to the second voltage difference, and wherein the second output transistor is configured to generate the second transconductance amplification current according to the second pre-amplification signal.

In one preferable embodiment, the first transconductance amplifier further includes a first preamplifier, wherein the first preamplifier is configured to generate the first pre-transconductance current at an output terminal of the first preamplifier according to the first voltage difference; the second transconductance amplifier further includes a second preamplifier, wherein the second preamplifier is configured to generate the second pre-transconductance current at an output terminal of the second preamplifier according to the second voltage difference.

In one preferable embodiment, the multi-loop error amplifier circuit is used in a multi-loop power converter, wherein the multi-loop power converter includes: a power stage circuit configured to convert an input power to an output power according to the error amplification signal; a first feedback circuit coupled to the first transconductance amplifier, the first feedback circuit being configured to generate a first feedback signal according to a first parameter related to the output power at the positive input terminal or the negative input terminal of the first transconductance amplifier; and a second feedback circuit coupled to the second transconductance amplifier, the second feedback circuit being configured to generate a second feedback signal according to a second parameter related to the output power at the positive input terminal or the negative input terminal of the second transconductance amplifier; wherein the multi-loop error amplifier circuit generates the error amplification signal in accordance with the first feedback signal and the second feedback signal to thereby regulating or clamping the first parameter related to the output power at a first target value, and/or regulating or clamping the second parameter related to the output power at a second target value.

In one preferable embodiment, the first parameter corresponds to the voltage of the output power, and/or the second parameter corresponds to the current of the output power.

From another perspective, the present invention provides a multi-loop power converter, comprising: a multi-loop error amplifier circuit configured to generate an error amplification signal; a power stage circuit configured to convert an input power to an output power according to the error amplification signal; a first feedback circuit configured to generate a first feedback signal according to a first parameter related to the output power; and a second feedback circuit configured to generate a second feedback signal according to a second parameter related to the output power; wherein the multi-loop error amplifier circuit includes: multi-loop error amplifier circuit configured to generate an error amplification signal, the multi-loop error amplifier circuit comprising: a first transconductance amplifier comprising a first current output stage, the first current output stage being configure to generate a first transconductance amplification current in a predetermined current direction according to a first voltage difference between a positive input terminal and a negative input terminal of the first transconductance amplifier, wherein the first transconductance amplification current is proportional to the first voltage difference; and a second transconductance amplifier comprising a second current output stage, the second current output stage being configure to generate a second transconductance amplification current in the predetermined current direction according to a second voltage difference between a positive input terminal and a negative input terminal of the second transconductance amplifier, wherein the second transconductance amplification current is proportional to the second voltage difference; wherein the first current output stage is in series connection with the second current output stage to generate a first error output current, whereby the error amplification signal is generated in accordance with the first error output current, wherein the first error output current is equal to a smaller one of the first transconductance amplification current and the second transconductance amplification current; wherein the first transconductance amplifier receives the first feedback signal at the positive input terminal or the negative input terminal of the first transconductance amplifier and the second transconductance amplifier receives the second feedback signal at the positive input terminal or the negative input terminal of the second transconductance amplifier, wherein the error amplifier circuit generates the error amplification signal in accordance with the first feedback signal and the second feedback signal, thereby regulating or clamping the first parameter related to the output power at a first target value, and/or regulating or clamping the second parameter related to the output power at a second target value.

From another perspective, the present invention also provides a method for controlling a multi-loop power converter to generate an output power, the method comprising: generating a first error amplification current in a first current output branch according to a difference between a first parameter related to the output power and a first target value, wherein the first error amplification current is proportional to the difference between the first parameter and first target value; generating a second error amplification current in a second current output branch according to a difference between a second parameter related to the output power and a second target value, wherein the second error amplification current is proportional to the difference between the second parameter and first target value; connecting the first current output branch and the second current output branch in series, so that the first error amplification current generated by the first current output branch and the second error amplification current generated by the second current output branch clamp each other to generate a first error output current, to thereby generate an error amplification signal, wherein the first error output current is equal to a smaller one of the first error amplification current and the second error amplification current; and regulating or clamping the first parameter related to the output power at the first target value according to the error amplification signal, and/or regulating or clamping the second parameter related to the output power at the second target value.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1A:
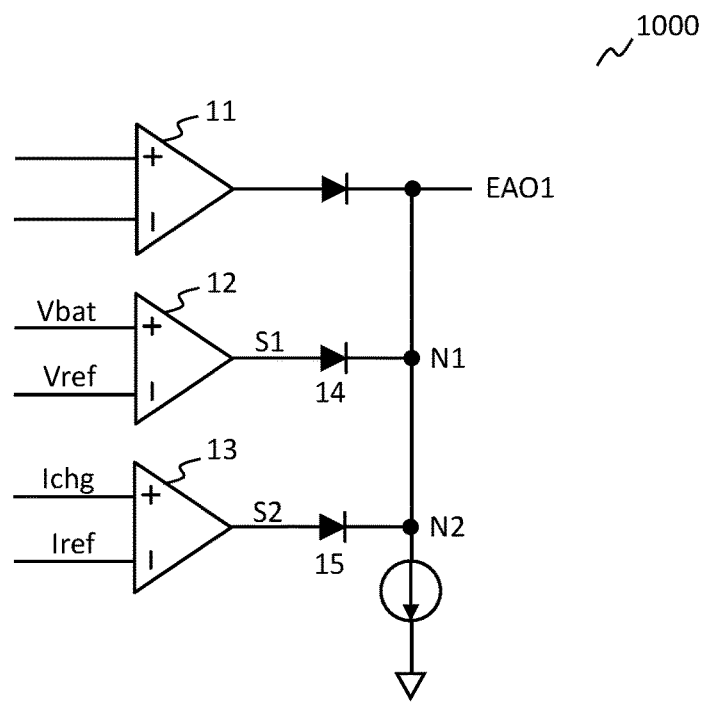
FIG. 1A shows a schematic diagram of a multi-loop error amplifier circuit of the prior art.
Figure 1B:
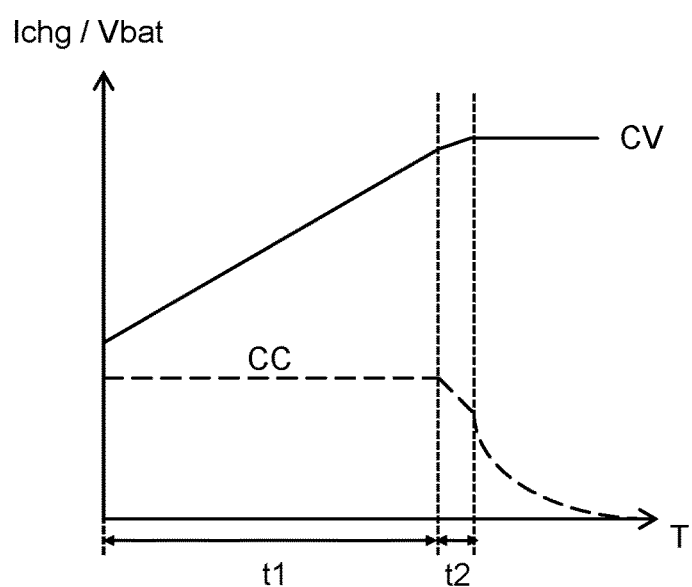
FIG. 1B shows the Current/Voltage versus time relationship of the multi-loop error amplifier circuit of the prior art of FIG. 1A when used for a Battery Management System (BMS).
Figure 2:
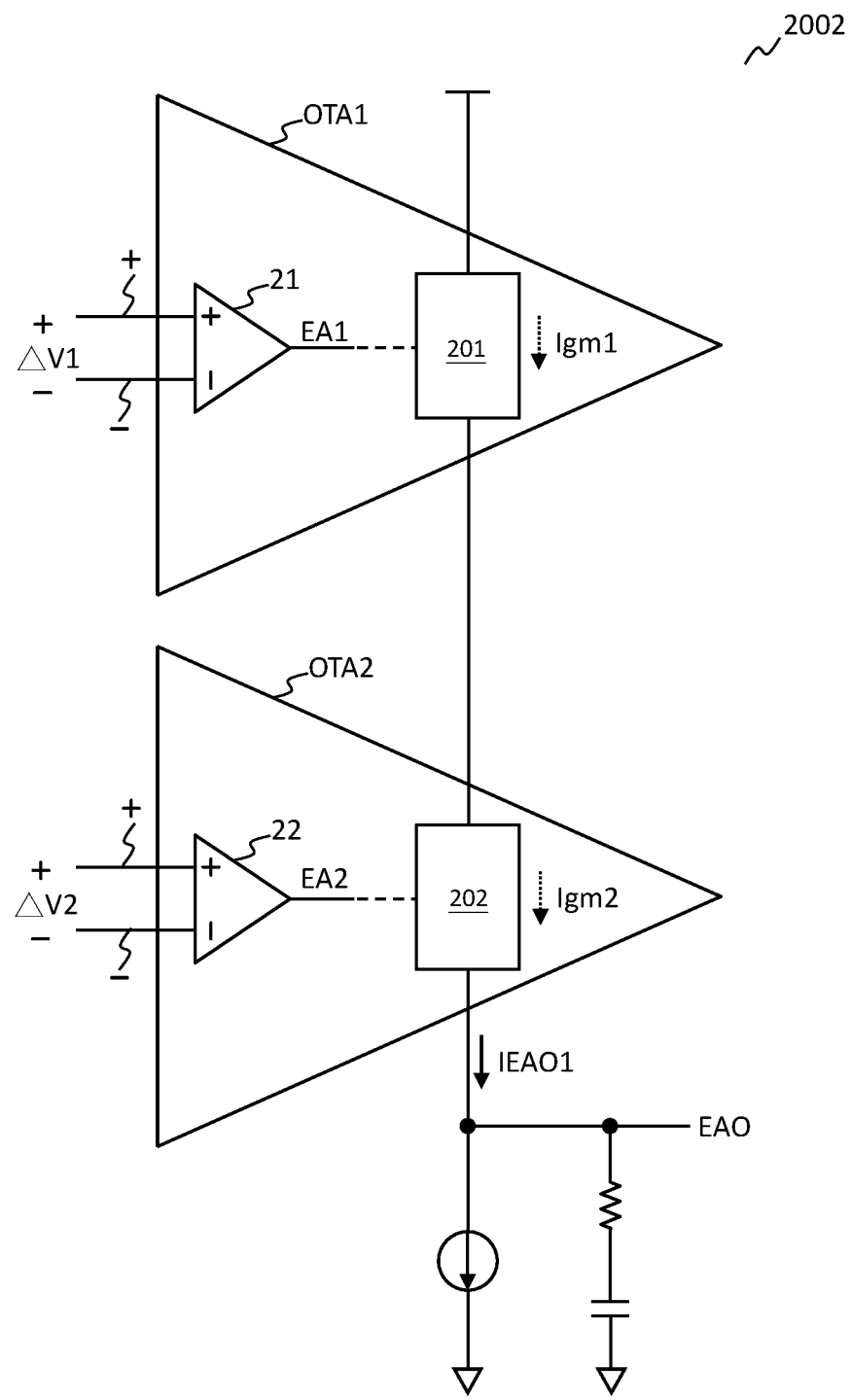
FIG. 2 shows a schematic block diagram of an embodiment of a multi-loop error amplifier circuit according to the present invention.

Please refer to FIG. 2. FIG. 2 shows a schematic block diagram of an embodiment of a multi-loop error amplifier circuit (multi-loop error amplifier circuit 2002) according to the present invention. As shown in FIG. 2, in one embodiment, the multi-loop error amplifier circuit 2002 is configured to generate an error amplification signal EAO, wherein the multi-loop error amplifier circuit 2002 includes: a first transconductance amplifier OTA1 and a second transconductance amplifier OTA2. In one embodiment, the first transconductance amplifier OTA1 includes a first current output stage 201, wherein the first current output stage 201 generates a first transconductance amplification current Igm1 in a predetermined current direction according to a first voltage difference ΔV1 between the positive input terminal (the input terminal marked "+", the same below) and the negative input terminal (the input terminal marked "−", the same below) of the first transconductance amplifier OTA1 wherein the predetermined current direction is for example a current sourcing or a current sinking direction, and wherein the first transconductance amplification current Igm1 is proportional to the first voltage difference ΔV1. In one embodiment, the second transconductance amplifier OTA2 includes a second current output stage 202, wherein the second current output stage 202 generates a second transconductance amplification current Igm2 in the predetermined current direction according to a second voltage difference ΔV2 between the positive input terminal and the negative input terminal of the second transconductance amplifier OTA2, wherein the second transconductance amplification current Igm2 is proportional to the second voltage difference ΔV2.

Please still refer to FIG. 2; in one embodiment, the first transconductance amplifier OTA1 further includes a first preamplifier 21, wherein the output terminal of the first preamplifier 21 is coupled to the first current output stage 201, and the first preamplifier 21 is configured to generate a first pre-amplification signal EA1 at the output terminal of the first preamplifier 21 according to the first voltage difference ΔV1, wherein the first current output stage 201 is configured to generate the first transconductance amplification current Igm1 according to the first pre-amplification signal EA1. In one embodiment, the second transconductance amplifier OTA2 further includes a second preamplifier 22, wherein the output terminal of the second preamplifier 22 is coupled to the second current output stage 202, and the second preamplifier 22 is configured to generate a second pre-amplification signal EA2 at the output terminal of the second preamplifier 22 according to the second voltage difference ΔV2, wherein the second current output stage 202 is configured to generate the second transconductance amplification current Igm2 according to the second preamplification signal EA2.

Please still refer to FIG. 2; in one embodiment, the first current output stage 201 and the second current output stage 202 are connected in series to generate a first error output current IEAO1, wherein the error amplification signal EAO is generated according to the first error output current IEAO1. In some embodiments, the error amplification signal EAO is proportional to the first error output current IEAO1, or the error amplification signal EAO is an integration of the first error output current IEAO1, wherein the first error output current IEAO1 is equal to the smaller one of the first transconductance amplification current Igm1 and the second transconductance amplification current Igm2.

Figure 3A:
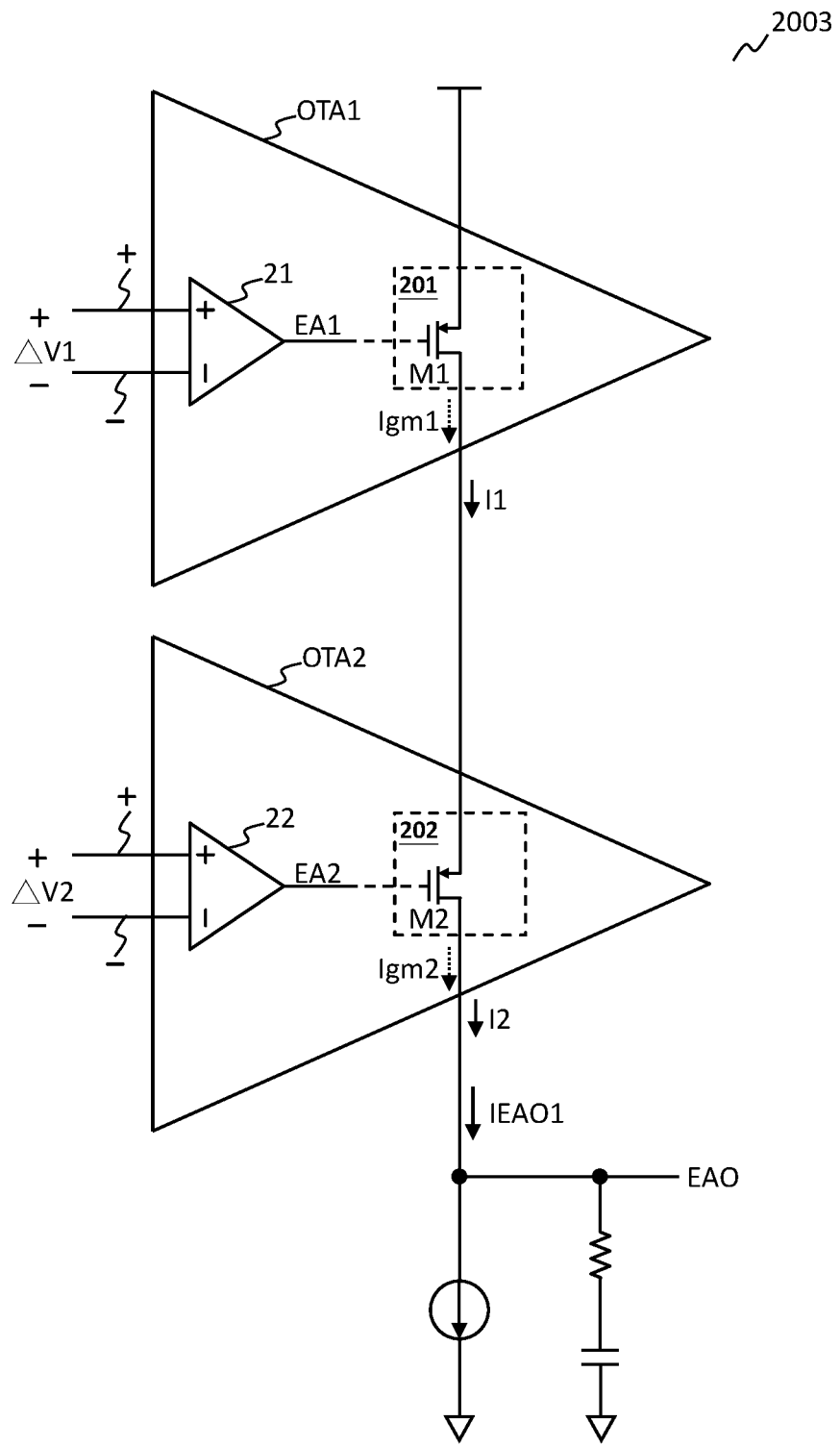
FIG. 3A shows a schematic circuit diagram of an embodiment of a multi-loop error amplifier circuit according to the present invention.

Please refer to FIG. 3A. FIG. 3A shows a schematic circuit diagram of an embodiment of a multi-loop error amplifier circuit (multi-loop error amplifier circuit 2003) according to the present invention. In one embodiment, the second current output stage 202 includes a second output transistor M2, wherein the first output transistor M1 and the second output transistor M2 are MOS (Metal-Oxide-Semiconductor) transistors of the same conductivity type, such as the PMOS transistors shown in FIG. 3A. In one embodiment, the first output transistor M1 and the second output transistor M2 are configured to generate the first transconductance amplification current Igm1 and the second transconductance amplification current Igm2 according to the first voltage difference ΔV1 and the second voltage difference ΔV2, respectively, wherein the first transconductance amplification current Igm1 is proportional to the product of the first voltage difference ΔV1 and a predetermined first transconductance value (i.e., the transconductance value of the first transconductance amplifier OTA1), and the second transconductance amplification current Igm2 is proportional to the product of the second voltage difference ΔV2 and a predetermined second transconductance value (i.e., the transconductance value of the second transconductance amplifier OTA2).

Referring to the figure, when the first output transistor M1 is in the operating range (e.g., in the saturation region), it can output the first transconductance amplification current Igm1, but first output transistor M1 cannot output the first transconductance amplification current Igm1 in the non-operating region (e.g., in the linear region); the same for the second output transistor M2. In this embodiment, the first output transistor M1 and the second output transistor M2 are in series connection with each other to generate the first error output current IEAO1. Note that when the first transconductance amplification current Igm1 and the second transconductance amplification current Igm2 are not equal, the first output transistor M1 and the second output transistor M2 cannot both operate in the saturation region at the same time.

More specifically, according to the present invention, when the first transconductance amplification current Igm1 is smaller than the second transconductance amplification current Igm2, the first output transistor M1 operates in the saturation region and the second output transistor M2 operates in the linear region. In this case, the level of the drain-source current I1 of the first output transistor M1 is equal to the first transconductance amplification current Igm1, and the level of the drain-source current I2 of the second output transistor M2 is clamped to the level of the first transconductance amplification current Igm1, so that the level of the first error output current IEAO1 is the first transconductance amplification current Igm1.

On the other hand, when the second transconductance amplification current Igm2 is smaller than the first transconductance amplification current Igm1, the second output transistor M2 operates in the saturation region and the first output transistor M1 operates in the linear region. In this case, the level of the drain-source current I2 of the second output transistor M2 is equal to the second transconductance amplification current Igm2, and the drain-source current I1 of the first output transistor M1 is clamped to the second transconductance amplification current Igm2, so that the level of the first error output current IEAO1 is the second transconductance amplification current Igm2.

Please still refer to FIG. 3; in one embodiment, the first transconductance amplifier OTA1 further includes a first preamplifier 21, wherein the output terminal of the first preamplifier 21 is coupled to the first current output stage 201, and the first preamplifier 21 is configured to generate the first pre-amplification signal EA1 at the output terminal of the first preamplifier 21 according to the first voltage difference $\Delta V1$, and, the first output transistor M1 is configured to generate the first transconductance amplification current Igm1 according to the first pre-amplification signal EA1. The second transconductance amplifier OTA2 further includes a second preamplifier 22, wherein the output terminal of the second preamplifier 22 is coupled to the second current output stage 202, and the second preamplifier 22 is configured to generate the second pre-amplification signal EA2 at the output terminal of the second preamplifier 22a according to the second voltage difference $\Delta V2$, and, the second output transistor M2 is configured to generate a second transconductance amplification current Igm2 according to the second pre-amplification signal EA2.

Figure 3B:
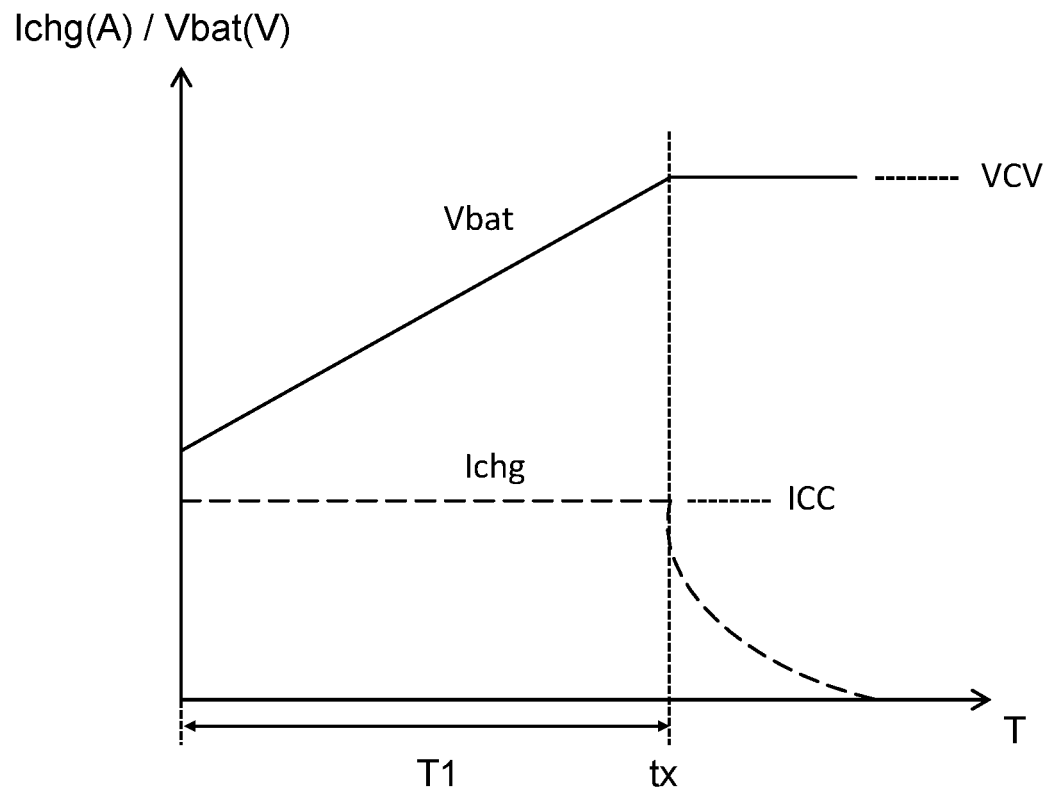
FIG. 3B shows the Current/Voltage versus time relationship of the multi-loop error amplifier circuit of FIG. 3A when used for a Battery Management System (BMS).

Please refer to FIG. 3B in conjunction with FIG. 3A. FIG. 3B shows the Current/Voltage versus time relationship of the multi-loop error amplifier circuit of FIG. 3A when used for a Battery Management System (BMS) (e.g., corresponding to the multi-loop power converter 3010 in FIG. 10). In this embodiment, the first preamplifier 21 is configured to feedback control the battery management system, for example, to control the battery management system to operate in a Constant Voltage (CV) mode, and the second preamplifier 22 is configured to feedback control the battery management system, for example, to control the battery management system to operate in a Constant Current (CC) mode, wherein the battery voltage Vbat and charging current Ichg change over time as shown in FIG. 3B. In one embodiment, in the T1 period, since the battery voltage Vbat is still far lower than the target voltage VCV in the Constant Voltage mode, the second transconductance amplification current Igm2 is smaller than the first transconductance amplification current Igm1; in this case, the level of the first error output current IEAO1 is the second transconductance amplification current Igm2. In other words, during the T1 period, the battery management system is controlled by the loop of the second transconductance amplifier OTA2, and the charging current Ichg charges the battery by the Constant Current mode with the target current ICC, and the difference between the battery voltage Vbat and the target voltage VCV of the Constant Voltage mode gradually decreases as the charging time increases, whereby the first transconductance amplification current Igm1 also gradually decreases. At the instant when the first transconductance amplification current Igm1 is smaller than the second transconductance amplification current Igm2 (e.g., at time point tx), the level of the first error output current IEAO1 immediately changes to the first transconductance amplifier current Igm1. In other words, the battery management system switches to be controlled by the loop of the first transconductance amplifier OTA1 from the time point tx, and the battery is charged by the Constant Voltage mode with the target voltage VCV. It should be noted that since the multi-loop error amplifier circuit of this invention is in a serial connection configuration, the transition between different loops can be completed instantly, for example, at the time point tx in the example shown in FIG. 3B, i.e., the control by second transconductance amplifier OTA2 is instantly switched to the control by the first transconductance amplifier OTA1 control, and there is no transition period as required in the prior art, so the problem of multi-loop cross-modulation can be completely solved and each loop can operate accurately during the transition.

Figure 4:
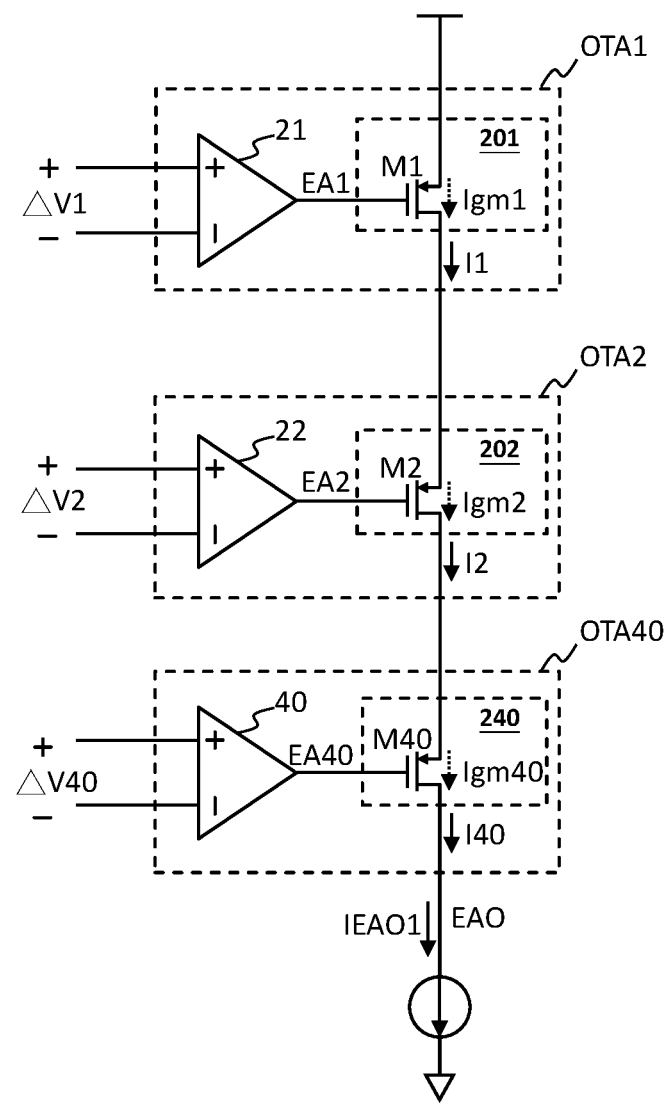
FIG. 4 shows a schematic circuit diagram of a specific embodiment of the multi-loop error amplifier circuit according to the present invention.

Please refer to FIG. 4. FIG. 4 shows a schematic circuit diagram of a specific embodiment of the multi-loop error amplifier circuit (multi-loop error amplifier circuit 2004) according to the present invention. In a specific embodiment, as shown in FIG. 4, the multi-loop error amplifier circuit 2004 further includes a transconductance amplifier OTA40, and the transconductance amplifier OTA40 includes a preamplifier 40 and a current output stage 240, wherein the current output stage 240 includes an output transistor M40.

In this embodiment, the first preamplifier 21 generates the first pre-amplification signal EA1 according to the voltage difference $\Delta V1$ between its positive input terminal and negative input terminal, to control the first output transistor M1 to generate the first transconductance amplification current Igm1, wherein the first transconductance amplification current Igm1 is proportional to the voltage difference $\Delta V1$. The second preamplifier 22 generates a second pre-amplification signal EA2 according to the voltage difference $\Delta V2$ between its positive input terminal and negative input terminal, to control the second output transistor M2 to generate the second transconductance amplification current Igm2, wherein the second transconductance amplification current Igm2 is proportional to the voltage difference $\Delta V2$. The preamplifier 40 generates the pre-amplification signal EA40 according to the voltage difference $\Delta V40$ between its positive input terminal and negative input terminal, for controlling the output transistor M40 to generate the transconductance amplification current Igm40, wherein the transconductance amplification current Igm40 is proportional to the voltage difference $\Delta V40$.

In this embodiment, since the drain-source current I1 of the output transistor M1, the drain-source current I2 of the output transistor M2 and the drain-source current I40 of the output transistor M40 are equal, therefore, the output transistor corresponding to the smallest one of the first transconductance amplification current Igm1, the second transconductance amplification current Igm2 and the transconductance amplification current Igm40 determines the transconductance amplification current which becomes the first error output current IEAO1, thereby generating error amplification signal EAO, and clamping the currents of the other two output transistors. For example, when the first transconductance amplification current Igm1 is the smallest one of the three transconductance amplification currents, the corresponding first output transistor M1 outputs the first transconductance amplification current Igm1 as the first error output current IEAO1, and the drain-source current I2 of the second output transistor M2 and the drain-source current I40 of the output transistor M40 are clamped at the first transconductance amplification current Igm1. It should be noted that when the three transconductance amplification currents are not equal, the first output transistor M1, the second output transistor M2 and the output transistor M40 cannot all operate in the saturation region at the same time; only the output transistor corresponding to the smallest transconductance amplification current operates in the saturation region.

Figure 5:
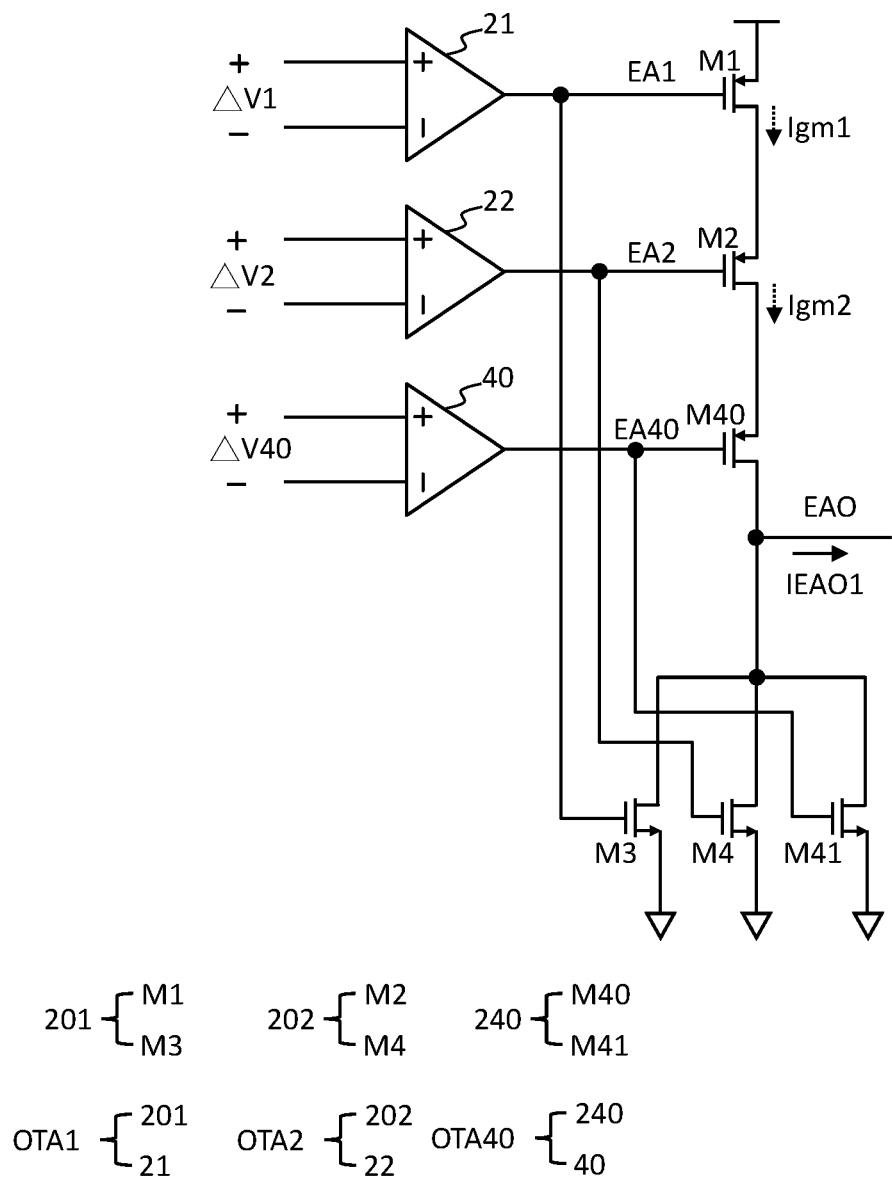
FIG. 5 shows a schematic circuit diagram of a specific embodiment of the multi-loop error amplifier circuit according to the present invention.

Please refer to FIG. 5. FIG. 5 shows a schematic circuit diagram of a specific embodiment of the multi-loop error amplifier circuit (multi-loop error amplifier circuit 2005) according to the present invention. The multi-loop error amplifier circuit 2005 of FIG. 5 is similar to the multi-loop error amplifier circuit 2004 of FIG. 4, but is different in that, in this embodiment, the first current output stage 201 of the multi-loop error amplifier circuit 2005 further includes a third output transistor M3; the second current output stage 202 further includes a fourth output transistor M4; and the current output stage 240 further includes an output transistor M41. In one embodiment, the gate of the third output transistor M3 is coupled to the gate of the first output transistor M1; the gate of the fourth output transistor M4 is coupled to the gate of the second output transistor M2; and the gate of the output transistor M41 is coupled to the gate of the output transistor M40. In other words, the third output transistor M3, the fourth output transistor M4, and the output transistor M41 are controlled by the first pre-amplification signal EA1, the second pre-amplification signal EA2, and the pre-amplification signal EA40, respectively.

In a specific embodiment, the third output transistor M3 and the first output transistor M1 are metal-oxide-semiconductor (MOS) transistors of complementary conductivity types; the fourth output transistor M4 and the second output transistor M2 are MOS transistors of complementary conductivity types; and the output transistor M40 and the output transistor M41 are MOS transistors of complementary conductivity types. For example, as shown in FIG. 5, the first output transistor M1, the second output transistor M2 and the output transistor M40 are PMOS transistors, while the third output transistor M3, the fourth output transistor M4 and the output transistor M41 are NMOS transistors. In this embodiment, the first output transistor M1 and the third output transistor M3 are configured to generate the first transconductance amplification current Igm1 in push-pull manner according to the first voltage difference ΔV1; the second output transistor M2 and the fourth output transistor M4 are configured to generate the second transconductance amplification current Igm2 in push-pull manner according to the second voltage difference ΔV2; and the output transistor M40 and the output transistor M41 are configured to generate a corresponding transconductance amplification current in push-pull manner according to the voltage difference ΔV40. The third output transistor M3, the fourth output transistor M4 and the output transistor M41 are coupled in parallel, to cooperate with the first output transistor M1, the second output transistor M2, and the output transistor M40 which are connected in series with each other generate the first error output current IEAO1 in push-pull manner.

Figure 6:
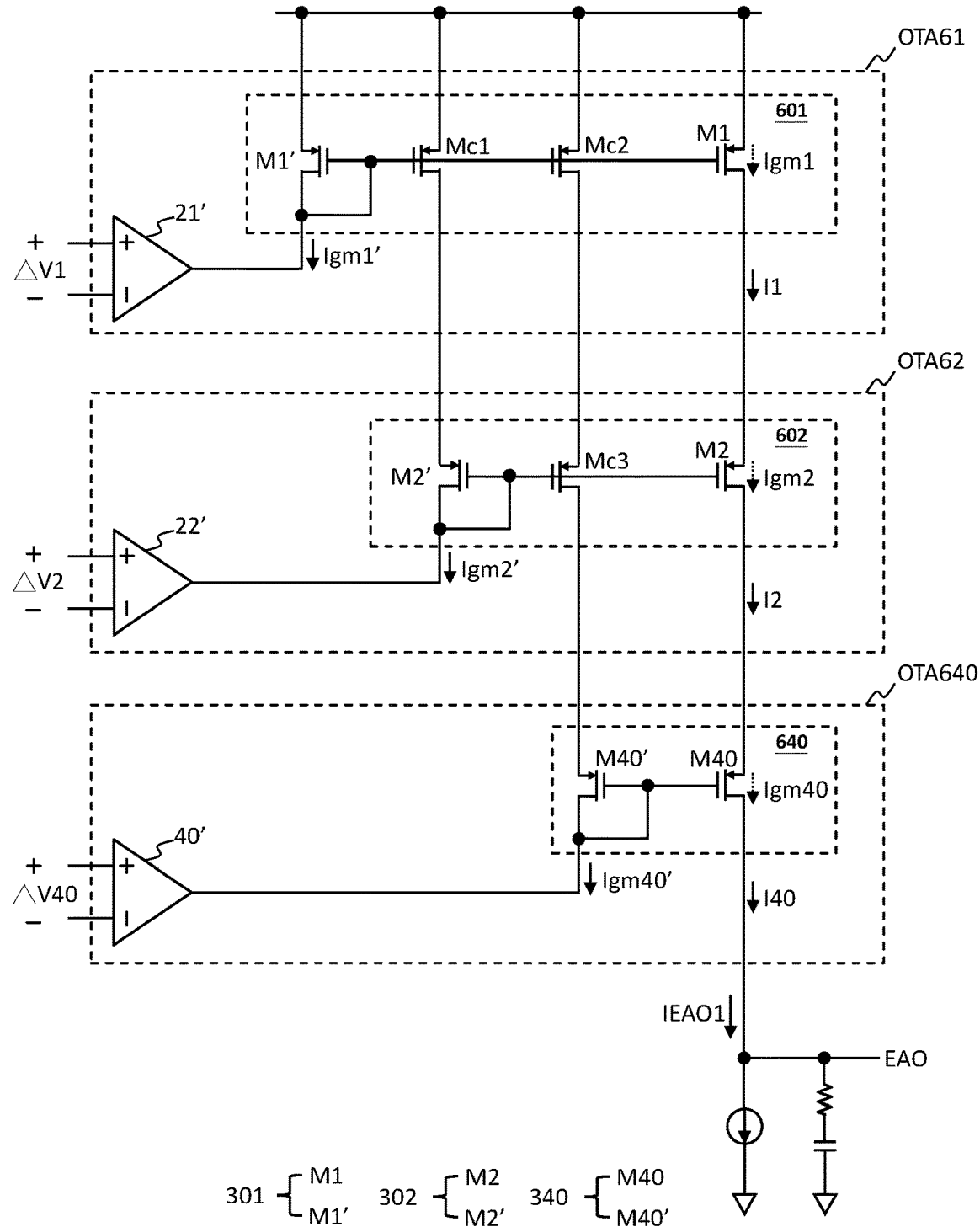
FIG. 6 shows a schematic circuit diagram of a specific embodiment of the multi-loop error amplifier circuit according to the present invention.

Please refer to FIG. 6. FIG. 6 shows a schematic circuit diagram of a specific embodiment of the multi-loop (multi-loop error amplifier circuit 2006) error amplifier circuit according to the present invention. In the embodiment of FIG. 6, the multi-loop error amplifier circuit 2006 includes a first transconductance amplifier OTA61, a second transconductance amplifier OTA62 and a transconductance amplifier OTA640. In this embodiment, the first transconductance amplifier OTA61 includes a first current output stage 601 and a first preamplifier 21'; the second transconductance amplifier OTA62 includes a second current output stage 602 and a second preamplifier 22'; and the transconductance amplifier OTA 640 includes a current output stage 640 and a preamplifier 40'.

As shown in FIG. 6, in this embodiment, the first current output stage 601 of the multi-loop error amplifier circuit 2006 includes a first current mirror 301, wherein the first current mirror 301 includes a first output transistor M1 and a transistor M1'. The first preamplifier 21' is configured to generate a first pre-transconductance current Igm1' at the output terminal of the first preamplifier 21' according to the first voltage difference ΔV1, wherein the first pre-transconductance current Igm1' is proportional to the product of the first voltage difference ΔV1 and the predetermined first transconductance value, and the first output transistor M1 is configured to mirror the first pre-transconductance current Igm1' to generate the first transconductance amplification current Igm1. In one embodiment, the second current output stage 602 includes a second current mirror 302, wherein the second current mirror 302 includes a second output transistor M2 and a transistor M2'. The second preamplifier 22' is configured to generate a second pre-transconductance current Igm2' at the output terminal of the second preamplifier 22' according to the second voltage difference ΔV2, wherein the second pre-transconductance current Igm2' is proportional to the product of the second voltage difference ΔV2 and the predetermined second transconductance value, and the second output transistor M2 is configured to mirror the second pre-transconductance current Igm2' to generate the second transconductance amplification current Igm2.

In one embodiment, the current output stage 640 includes a current mirror 340, and the current mirror 340 includes an output transistor M40 and a transistor M40'. The preamplifier 40' is configured to generate a pre-transconductance current Igm40' at the output terminal of the preamplifier 40' according to the voltage difference ΔV40, and the pre-transconductance current Igm40' is proportional to the product of the voltage difference ΔV40 and a predetermined transconductance value (i.e., the transconductance value of the transconductance amplifier OTA40). The output transistor M40 is configured to mirror the pre-transconductance current Igm40' to generate the transconductance amplification current Igm40.

Please still refer to FIG. 6. In one embodiment, the first current output stage 601 further includes a cascode transistor Mc1 and a cascode transistor Mc2, and the second current output stage 602 further includes a cascode transistor Mc3. In one embodiment, the cascode transistor Mc1 is coupled to the second current mirror 302, and the gate of the cascode transistors Mc1 and the gate of the first output transistor M1 are coupled to each other, so that the gate-source voltage of the transistor M2' matches the gate-source voltage of the second output transistor M2, to ensure the accuracy of the second current mirror 302. In one embodiment, the cascode transistor Mc2 and the cascode transistor Mc3 are cascoded in series connection with each other and are coupled to the current mirror 340. In one embodiment, the cascode transistor Mc2 and the cascode transistor Mc3 are cascoded in series connection with each other, and are coupled to the current mirror 340, wherein the gate of the cascode transistor Mc2 and the gate of the first output transistor M1 are coupled to each other, and the gate of the cascode transistor Mc3 and the gate of the second output transistor M2 are coupled to each other, so that the gate-source voltage of the transistor M40' matches the gate-source voltage of the output transistor M40, to ensure the accuracy of the current mirror 340.

In FIG. 6, since the drain-source current I1 of the output transistor M1, the drain-source current I2 of the output transistor M2 and the drain-source current I40 of the output transistor M40 are equal, therefore, the first error output current IEAO1 is equal to the smallest one of the first transconductance amplification current Igm1, the second transconductance amplification current Igm2 and the transconductance amplification current Igm40. The detailed operational relationship of the first transconductance amplifier OTA1, the second transconductance amplifier OTA2, and the transconductance amplifier OTA40 can be derived from the foregoing embodiments and are not described here again. It should be noted that, in the embodiments of FIGS. 4 to 6, the predetermined current direction is the current sourcing direction outflowing from the internal power source.

Figure 7:
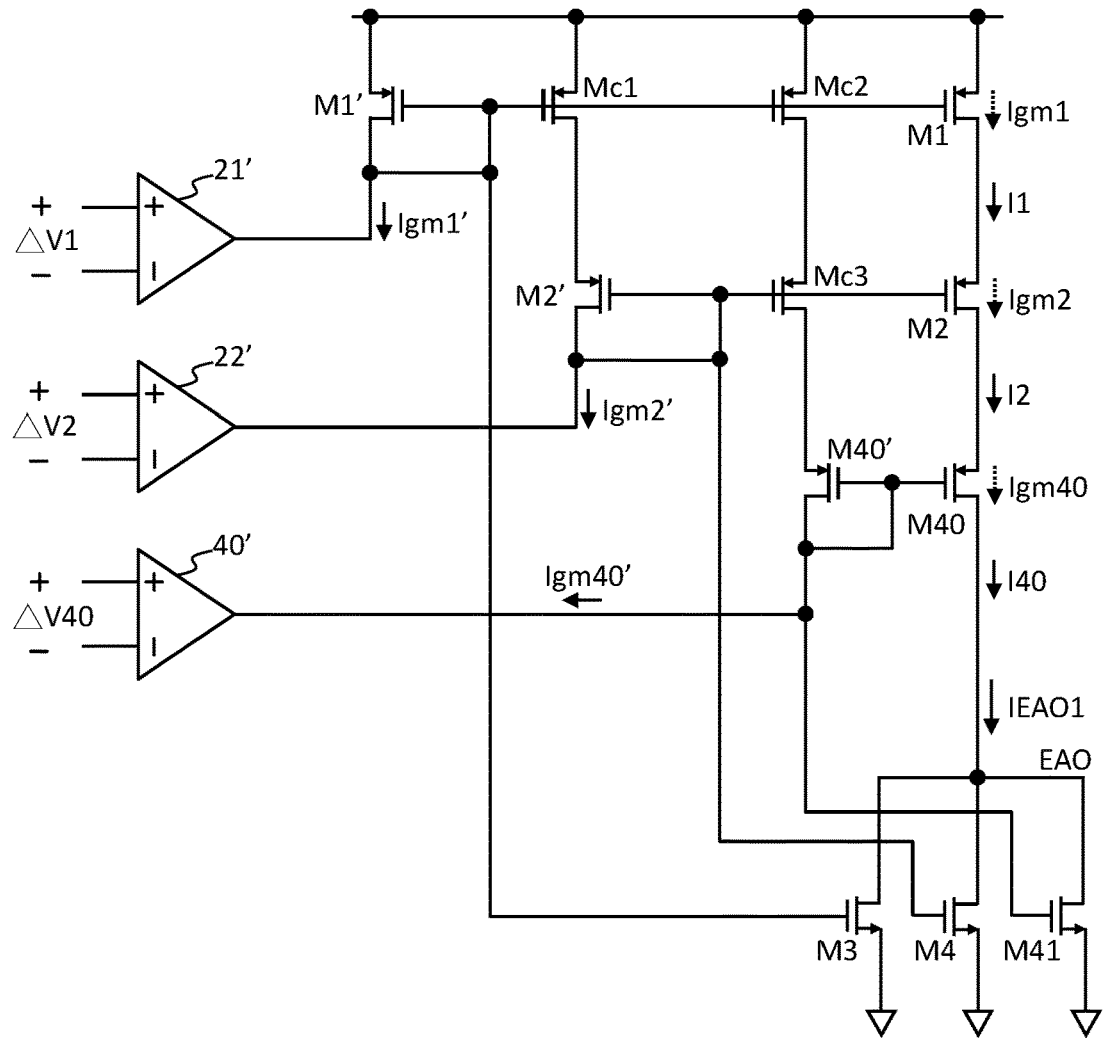
FIG. 7 shows a schematic circuit diagram of a specific embodiment of the multi-loop error amplifier circuit according to the present invention.

Please refer to FIG. 7. FIG. 7 shows a schematic diagram of a specific circuit embodiment of the multi-loop error amplifier circuit (multi-loop error amplifier circuit 2007) according to the present invention. The multi-loop error amplifier circuit 2007 of FIG. 7 is similar to the multi-loop error amplifier circuit 2006 of FIG. 6, but is different in that, in this embodiment, the first current output stage 701 further includes a third output transistor M3; the second current output stage 702 further includes a fourth output transistor M4; and the current output stage 740 further includes an output transistor M41. In one embodiment, the gate of the third output transistor M3 is coupled to the gate of the first output transistor M1; the gate of the fourth output transistor M4 is coupled to the gate of the second output transistor M2; the gate of the output transistor M41 is coupled to the drain of the transistor M40'; and the third output transistor M3 and the fourth output transistor M4 are coupled in parallel with the output transistor M41, thereby generating the first error output current IEAO1 in push-pull manner. For details of the operation, please refer to the description of the embodiment in FIG. 5.

When the multi-loop error amplifier circuit has more current output stages, if all current output stages are connected in series, the current output stages may not be able to operate normally at a lower power voltage. According to the present invention, in some embodiments, the error output current can be generated by a hierarchical comparison method; for instance, the current output stages can be divided in groups and first compared within the group, and next the result of the groups can be compared to generate the final result (i.e., to generate the error output current).

Figure 8:
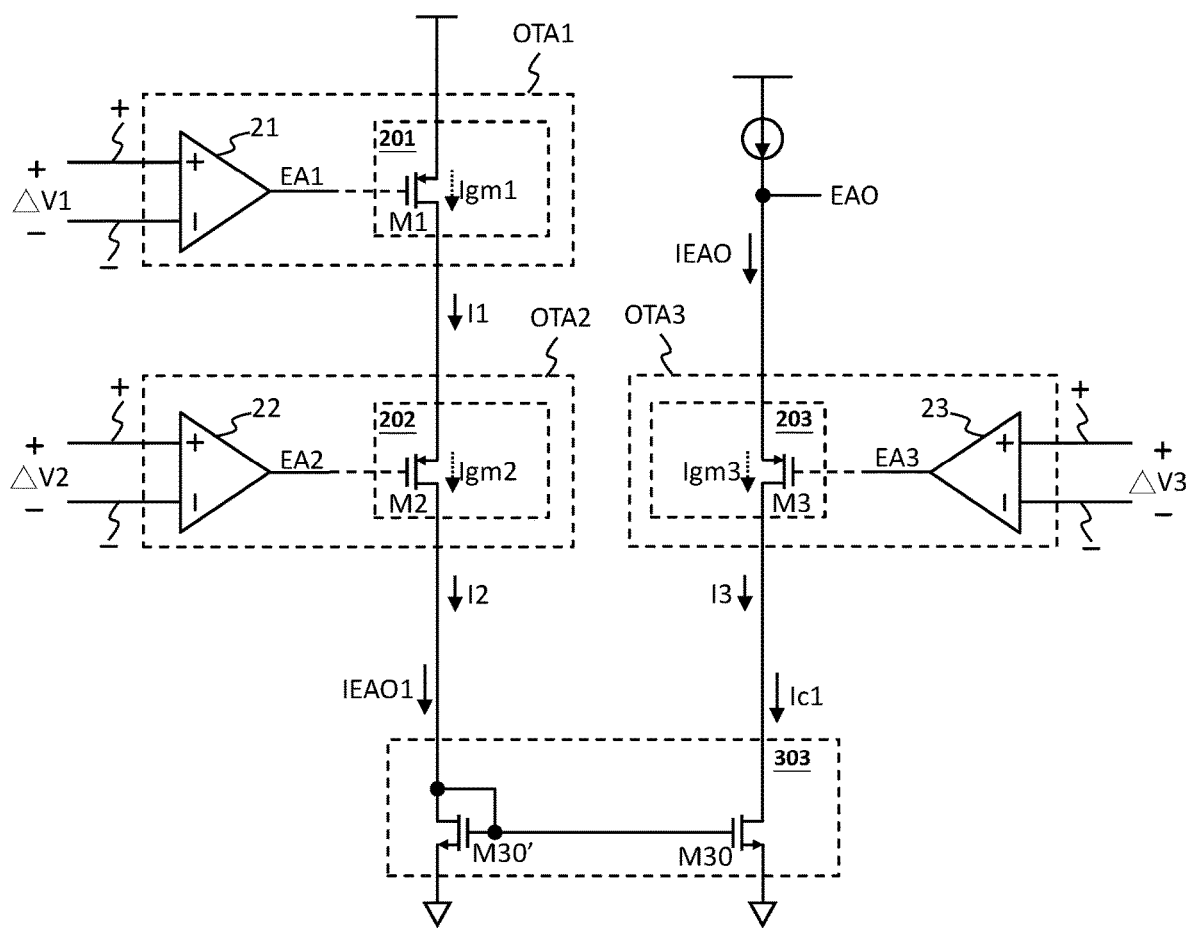
FIG. 8 shows a schematic circuit diagram of an embodiment of a multi-loop error amplifier circuit according to the present invention.

Please refer to FIG. 8A. FIG. 8A shows a schematic diagram of an embodiment of a multi-loop error amplifier circuit (multi-loop error amplifier circuit 2008) according to the present invention. The multi-loop error amplifier circuit 2008 of FIG. 8 is similar to the multi-loop error amplifier circuit 2003 of FIG. 3A, but is different in that, in this embodiment, the multi-loop error amplifier circuit 2008 further includes a third current mirror 303. In one embodiment, the third current mirror 303 includes a mirror transistor M30' coupled in the form of a diode, and a mirror transistor M30, wherein the third current mirror 303 is configured to mirror the first error output current IEAO1 to generate the first comparison current Ic1 at a current output branch (e.g., the mirror transistor M30) of the third current mirror 303. The mirror transistor M30 can be connected in series with another current output branch to output the smaller one of the two branches as a gross output current IEAO. In one embodiment, the other current output branch is the output transistor of another transconductance amplifier, or in another embodiment, the other current output branch is the comparison result of plural other transconductance output currents. It should be noted that the mirror transistor M30 can mirror the first error output current IEAO1 when the mirror transistor M30 operates in the operating range (e.g., in the saturation region), and in this case the first comparison current Ic1 is proportional to the first error output current IEAO1, but when the mirror transistor M30 operates in the non-operating region (e.g., in the linear region), the mirror transistor M30 cannot mirror the first error output current IEAO1, and in this case the first comparison current Ic1 is not proportional to the first error output current IEAO1.

Please still refer to FIG. 8. In one embodiment, the multi-loop error amplifier circuit 2008 further includes a third transconductance amplifier OTA3, and the third transconductance amplifier OTA3 includes a third current output stage 203 and a preamplifier 23, wherein the preamplifier 23 generates the pre-amplification signal EA3 according to the third voltage difference $\Delta V3$ between the positive input terminal and the negative input terminal of the third transconductance amplifier OTA3. The third current output stage 203 (i.e., output transistor M3) generates a third transconductance amplification current Igm3 in a predetermined current direction according to the pre-amplification signal EA3, wherein the third transconductance amplification current Igm3 is proportional to the third voltage difference $\Delta V3$. In this embodiment, the mirror transistor M30 of the third current mirror 303 corresponds to the aforementioned current output branch; the output transistor M3 of the third current output stage 203 corresponds to the aforementioned other current output branch; and the mirror transistor M30 is connected in series with the output transistor M3, to generate the gross output current IEAO. More specifically, since the drain-source current I3 of the output transistor M3 and the drain-source current of the mirror transistor M30 are equal, therefore, the smaller one of the first comparison current Ic1 generated by the third current mirror 303 and the third transconductance amplification current Igm3 is outputted as the gross output current IEAO.

In one embodiment, when the first comparison current Ic1 is smaller than the third transconductance amplification current Igm3, the first comparison current Ic1 is outputted as the gross output current IEAO, and the current of the other current output branch (i.e., the drain-source current I3 of the output transistor M3) is clamped to the first comparison current Ic1; when the third transconductance amplification current Igm3 is smaller than the first comparison current Ic1, the third transconductance amplification current Igm3 is outputted as the gross output current IEAO, and the current generated by the third current mirror 303 is clamped to the third transconductance amplification current Igm3. It should be noted that, in this embodiment, the gross output current IEAO is equal to the smallest one of the first transconductance amplification current Igm1, the second transconductance amplification current Igm2 and the third transconductance amplification current Igm3. In this embodiment, the error amplification signal EAO is generated according to the gross output current IEAO.

Figure 9:
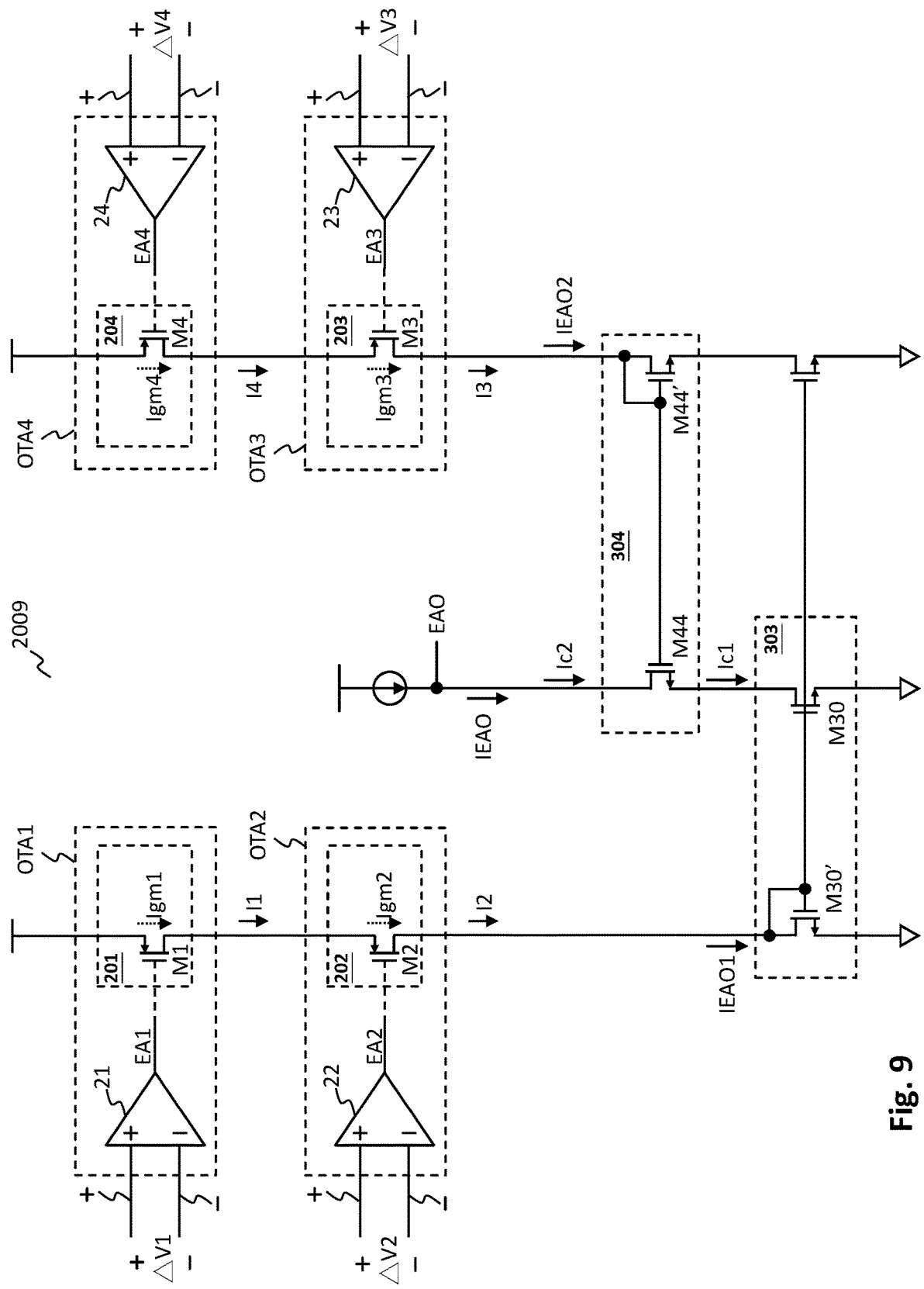
FIG. 9 shows a schematic circuit diagram of a specific embodiment of the multi-loop error amplifier circuit according to the present invention.

Please refer to FIG. 9. FIG. 9 shows a schematic circuit diagram of a specific embodiment of the multi-loop error amplifier circuit (multi-loop error amplifier circuit 2009) according to the present invention. The multi-loop error amplifier circuit 2009 is similar to the multi-loop error amplifier circuit 2008, but is different in that, in this embodiment, the multi-loop error amplifier circuit 2009 further includes: a fourth transconductance amplifier OTA4 and a fourth current mirror 304. The fourth transconductance amplifier OTA4 includes a fourth current output stage 204 and a preamplifier 24, wherein the preamplifier 24 is configured to generate a pre-amplification signal EA4 according to the fourth voltage difference ΔV4 between the positive input terminal and the negative input terminal of the fourth transconductance amplifier OTA4, and the fourth current output stage 204 (i.e., output transistor M4) generates a fourth transconductance amplification current Igm4 in a predetermined current direction according to the pre-amplification signal EA4, wherein the fourth transconductance amplification current Igm4 is proportional to the fourth voltage difference ΔV4. In one embodiment, the third current output stage 203 is connected in series connection with the fourth current output stage 204 to generate the second error output current IEAO2. Since the drain-source current I3 of the output transistor M3 and the drain-source current I4 of the output transistor M4 are equal, therefore, the second error output current IEAO2 is equal to the smaller one of the third transconductance amplification current Igm3 and the fourth transconductance amplification current Igm4. In one embodiment, the fourth current mirror 304 includes a mirror transistor M44' coupled in the form of a diode, and a mirror transistor M44. The fourth current mirror 304 is configured to mirror a second error output current IEAO2 to generate a second comparison current Ic2 in a current output branch (i.e., mirror transistor M44) of the fourth current mirror 304.

Since the drain-source current of the mirror transistor M30 and the drain-source current of the mirror transistor M44 are equal, therefore, the smaller one of the first comparison current Ic1 generated by the third current mirror 303 and the second comparison current Ic2 generated by the fourth current mirror 304 is outputted as the gross output current IEAO. As shown in FIG. 9, in this embodiment, when the first comparison current Ic1 is smaller than the second comparison current Ic2, the current output branch of the third current mirror 303 generates the first comparison current Ic1 as the gross output current IEAO and clamps the current generated by the fourth current mirror 304 to the first comparison current Ic1; when the second comparison current Ic2 is smaller than the first comparison current Ic1, the current output branch of the fourth current mirror 304 generates the second comparison current Ic2 as the gross output current IEAO, and the third current mirror 303 clamps the current generated by the third current mirror to the second comparison current Ic2. It should be noted that the gross output current IEAO is equal to the smallest one of the first transconductance amplification current Igm1, the second transconductance amplification current Igm2, the third transconductance amplification current Igm3 and the fourth transconductance amplification current Igm4.

Figure 10:
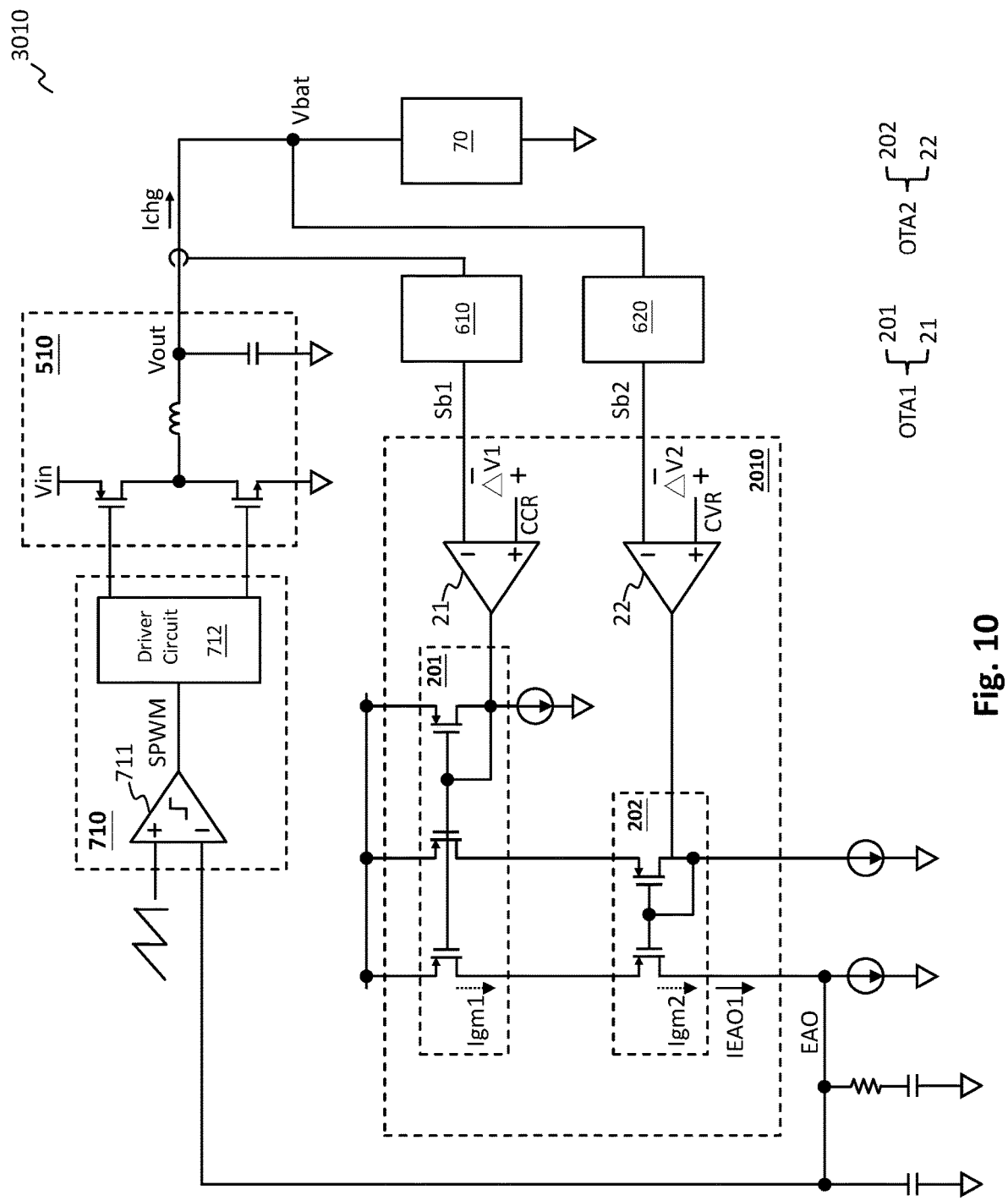
FIG. 10 shows a schematic block diagram of an embodiment of a multi-loop power converter according to the present invention.

Please refer to FIG. 10. FIG. 10 shows a schematic diagram of an embodiment of a multi-loop power converter (multi-loop power converter 3010) according to the present invention. In one embodiment, the multi-loop power converter 3010 includes: a multi-loop error amplifier circuit 2010, a power stage circuit 510, a first feedback circuit 610 and a second feedback circuit 620. In one embodiment, the multi-loop error amplifier circuit 2010 is configured to generate the error amplification signal EAO; the power stage circuit 510 is configured to convert the input power Vin to generate the output power Vout according to the error amplification signal EAO; the first feedback circuit 610 is configured to generate a first feedback signal Sb1 according to a first parameter (e.g. charging current Ichg) related to the output power; the second feedback circuit 620 is configured to generate a second feedback signal Sb2 according to a second parameter (e.g. battery voltage Vbat) related to the output power.

In a specific embodiment, the power stage circuit 510 is for example a step-down switching converter as shown in FIG. 10, and the multi-loop power converter 3010 further includes a control and driver circuit 710. In this embodiment, the control and driver circuit 710 includes a pulse width modulation circuit 711 and a driver circuit 712, and the pulse width modulation circuit 711 is configured to compare the error amplification signal EAO with a ramp signal to generate a pulse width modulation signal SPWM. The driver circuit 712 is configured to generate a driving signal according to the pulse width modulation signal SPWM to control the power switches in the power stage circuit 510 to perform a step-down type switching inductive power conversion to generate the output power Vout.

It should be noted that the above-mentioned power stage circuit 510 and the control and driver circuit 710 are only illustrative examples but not to limit the broadest scope of the present invention. In other embodiments, the power stage circuit may be another type of switching power converter or a linear power converter.

In one embodiment, the multi-loop error amplifier circuit 2010 includes: a first transconductance amplifier OTA1 and a second transconductance amplifier OTA2. The first current output stage 201 and the second current output stage 202 are connected in series to generate a first error output current IEAO1, wherein the error amplification signal EAO is generated according to the first error output current IEAO1, and wherein the first error output current IEAO1 is equal to the smaller one of the first transconductance amplification current Igm1 and the second transconductance amplification current Igm2 (please refer to the description of the embodiment of FIG. 6).

Referring also to FIG. 3B, the operation waveform shown in FIG. 3B may correspond to the embodiment of FIG. 10. For example, the multi-loop power converter 3010 can be used to charge a load battery 70, and the first preamplifier 21 is configured to, e.g., feedback control the multi-loop power converter 3010 to operate in the Constant Current mode, and the second preamplifier 22 is configured to, e.g., feedback control the multi-loop power converter 3010 to operate in the Constant Voltage mode. In one embodiment, the first transconductance amplifier OTA1 generates a first transconductance amplification current Igm1 according to the difference between the reference signal CCR and the first feedback signal Sb1, and the second transconductance amplifier OTA2 generates a second transconductance amplification current Igm2 according to the difference between the reference signal CVR and the second feedback signal Sb2, so as to generate the error amplification signal EAO, thereby regulating or clamping the charging current Ichg at the target current ICC, that is, to charge the load battery 70 with a Constant Current, and/or, thereby regulating or clamping the battery voltage Vbat related to the output power Vout at the target voltage VCV. that is, to charge the load battery 70 with a Constant Voltage mode, wherein the target current ICC is related to the reference signal CCR and the target voltage VCV is related to the reference signal CVR.

Referring to both FIG. 10 and FIG. 3B, assuming that at the beginning when the charging operation starts, the battery voltage Vbat of the load battery 70 is less than the predetermined threshold (corresponding to the target voltage VCV), in this case, the first transconductance amplification current Igm1 is smaller than the second transconductance amplification current Igm2, so the first transconductance amplifier OTA1 takes control to regulate the charging current Ichg related to the output power Vout to the target current ICC, so as to charge the load battery 70 with a Constant Current mode. At the instant when the voltage of the load battery 70 becomes greater than the predetermined threshold, the second transconductance amplification current Igm2 becomes smaller than the first transconductance amplification current Igm1. At this instant, the second transconductance amplifier OTA2 takes control, to regulate the battery voltage Vbat related to the output power Vout to the target voltage VCV and charge the load battery 70 with Constant Voltage mode.

From one perspective, the multi-loop error amplifier circuit of the present invention makes use of the principle that the same branch in a serial connection structure produces the same current, whereby the present invention couple the loops in a serial connection; as a result, the transition between different loops can be achieved instantly and smoothly, and the accuracy of each loop is enhanced. Thus, the cross-modulation problem between multiple loops is completed solved. Moreover, the multi-loop error amplifier circuit of the present invention is applicable to various different systems.

The present invention has been described in considerable detail with reference to certain preferred embodiments thereof. It should be understood that the description is for illustrative purpose, not for limiting the scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. Furthermore, those skilled in this art can readily conceive variations and modifications within the spirit of the present invention. As an example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. The spirit of the present invention should cover all such and other modifications and variations, which should be interpreted to fall within the scope of the following claims and their equivalents.

What is claimed is:

1. A multi-loop error amplifier circuit configured to generate an error amplification signal, the multi-loop error amplifier circuit comprising:

a first transconductance amplifier comprising a first current output stage, the first current output stage being configure to generate a first transconductance amplification current in a predetermined current direction according to a first voltage difference between a positive input terminal and a negative input terminal of the first transconductance amplifier, wherein the first transconductance amplification current is proportional to the first voltage difference; and a second transconductance amplifier comprising a second current output stage, the second current output stage being configure to generate a second transconductance amplification current in the predetermined current direction according to a second voltage difference between a positive input terminal and a negative input terminal of the second transconductance amplifier, wherein the second transconductance amplification current is proportional to the second voltage difference;

wherein the first current output stage is in series connection with the second current output stage to generate a first error output current, whereby the error amplification signal is generated in accordance with the first error output current, wherein the first error output current is equal to a smaller one of the first transconductance amplification current and the second transconductance amplification current;

wherein the first current output stage includes a first output transistor, and the second current output stage includes a second output transistor, wherein the first output transistor and the second output transistor are MOSFETS (Metal-Oxide-Semiconductor Field Effect Transistors) of the same conductivity type, wherein the first output transistor and the second output transistor are configured to generate the first transconductance amplification current and the second transconductance amplification current according to the first voltage difference and the second voltage difference, respectively, wherein the first output transistor is connected in series with the second output transistor to generate the first error output current;

wherein, when the first transconductance amplification current is smaller than the second transconductance amplification current, the first output transistor outputs the first transconductance amplification current as the first error output current, and clamps the current of the second output transistor to the first transconductance amplification current;

wherein, when the second transconductance amplification current is smaller than the first transconductance amplification current, the second output transistor outputs the second transconductance amplification current as the first error output current and clamps the current of the first output transistor to the second transconductance amplification current;

wherein the first current output stage and the second current output stage are further configured as one of the following:

(1) the first current output stage further includes a first current mirror, the first current mirror including the first output transistor, wherein the first output transistor mirrors a first pre-transconductance current to generate the first transconductance amplification current, and/or, the second current output stage further includes a second current mirror, the second current mirror including the second output transistor, wherein the second output transistor mirrors a second pre-transconductance current to generate the second transconductance amplification current, wherein the first pre-transconductance current is proportional to a product of the first voltage difference and a predetermined first transconductance value, and the second pre-transconductance current is proportional to a product of the second voltage difference and a predetermined second transconductance value; or (2) the first current output stage further includes a third output transistor, and the second current output stage further includes a fourth output transistor, wherein the third output transistor and the first output transistor are MOS transistors of complementary conductivity types, and the fourth output transistor and the second output transistor are MOS transistors of complementary conductivity types;

wherein the first output transistor and the third output transistor are configured to generate the first transconductance amplification current in push-pull manner according to the first voltage difference, and the second output transistor and the fourth output transistor are configured to generate the second transconductance amplification current in push-pull manner according to the second voltage difference;

wherein the third output transistor is coupled in parallel with the fourth output transistor, thereby generating the first error output current in push-pull manner.

2. The multi-loop error amplifier circuit as claimed in claim 1, wherein when the first current output stage and the second current output stage are further configured as (1), the first current output stage further includes a cascode transistor which is coupled to the second current mirror to assist matching of the transistors of the second current mirror, so as to ensure a mirror accuracy of the second current mirror.

3. The multi-loop error amplifier circuit as claimed in claim 1, wherein when the first transconductance amplification current is smaller than the second transconductance amplification current, the first output transistor operates in a saturation region and the second output transistor operates in a linear region;

wherein when the second transconductance amplification current is smaller than the first transconductance amplification current, the second output transistor operates in a saturation region and the first output transistor operates in a linear region.

4. The multi-loop error amplifier circuit as claimed in claim 1, further comprising:

a third current mirror for mirroring the first error output current to generate a first comparison current in a current output branch of the third current mirror; and a third transconductance amplifier including a third current output stage, wherein the third current output stage generates a third transconductance amplification current in the predetermined current direction according to a third voltage difference between a positive input terminal and a negative input terminal of the third transconductance amplifier, wherein the third transconductance amplification current is proportional to the third voltage difference;

wherein the current output branch of the third current mirror is connected in series with another current output branch to generate a gross output current, wherein the other current output branch is configured to generate a second comparison current according to the third transconductance amplification current;

wherein when the first comparison current is smaller than the second comparison current, the current output branch of the third current mirror generates the first comparison current as the gross output current and clamps the current of the other current output branch at the first comparison current;

wherein when the second comparison current is smaller than the first comparison current, the other current output branch generates the second comparison current as the gross output current and clamp the current generated by the third current mirror to the second comparison current;

wherein the gross output current is equal to a smallest one of the first transconductance amplification current, the second transconductance amplification current, and the second comparison current;

wherein the error amplification signal is generated according to the gross output current.

5. The multi-loop error amplifier circuit as claimed in claim 4, further comprising:

a fourth transconductance amplifier including a fourth current output stage, wherein the fourth current output stage generates a fourth transconductance amplification current in the predetermined current direction according to a fourth voltage difference between a positive input terminal and a negative input terminal of the fourth transconductance amplifier, wherein the fourth transconductance amplification current is proportional to the fourth voltage difference;

wherein the third current output stage is connected in series with the fourth current output stage to generate a second error output current, wherein the second error output current is equal to a smaller one of the third transconductance amplification current and the fourth transconductance amplification current; and a fourth current mirror for mirroring the second error output current to generate the second comparison current in the other current output branch;

wherein when the first comparison current is smaller than the second comparison current, the current output branch of the third current mirror generates the first comparison current as the gross output current and clamps the current generated by the fourth current mirror at the first comparison current;

wherein when the second comparison current is smaller than the first comparison current, the other current output branch of the fourth current mirror generates the second comparison current as the gross output current and clamp the current generated by the third current mirror to the second comparison current;

wherein the gross output current is equal to a smallest one of the first transconductance amplification current, the second transconductance the amplification current, third the fourth transconductance amplification current and transconductance amplification current.

6. The multi-loop error amplifier circuit as claimed in claim 1, wherein when the first current output stage and the second current output stage are further configured as (2), the first transconductance amplifier further includes a first preamplifier, wherein an output terminal of the first preamplifier is coupled to the first current output stage, wherein the first preamplifier is configured to generate a first pre-amplification signal at the output terminal of the first preamplifier according to the first voltage difference, and wherein the first output transistor is configured to generate the first transconductance amplification current according to the first pre-amplification signal; and wherein the second transconductance amplifier further includes a second preamplifier, wherein an output terminal of the second preamplifier is coupled to the second current output stage, wherein the second preamplifier is configured to generate a second pre-amplification signal at the output terminal of the second preamplifier according to the second voltage difference, and wherein the second output transistor is configured to generate the second transconductance amplification current according to the second pre-amplification signal.

7. The multi-loop error amplifier circuit as claimed in claim 1, wherein when the first current output stage and the second current output stage are further configured as (1), the first transconductance amplifier further includes a first preamplifier, wherein the first preamplifier is configured to generate the first pre-transconductance current at an output terminal of the first preamplifier according to the first voltage difference; and wherein the second transconductance amplifier further includes a second preamplifier, wherein the second preamplifier is configured to generate the second pre-transconductance current at an output terminal of the second preamplifier according to the second voltage difference.

8. The multi-loop error amplifier circuit as claimed in claim 1, which is for use in a multi-loop power converter, wherein the multi-loop power converter includes:

a power stage circuit configured to convert an input power to an output power according to the error amplification signal;

a first feedback circuit coupled to the first transconductance amplifier, the first feedback circuit being configured to generate a first feedback signal according to a first parameter related to the output power at the positive input terminal or the negative input terminal of the first transconductance amplifier; and a second feedback circuit coupled to the second transconductance amplifier, the second feedback circuit being configured to generate a second feedback signal according to a second parameter related to the output power at the positive input terminal or the negative input terminal of the second transconductance amplifier;

wherein the multi-loop error amplifier circuit generates the error amplification signal in accordance with the first feedback signal and the second feedback signal to thereby regulating or clamping the first parameter related to the output power at a first target value, and/or regulating or clamping the second parameter related to the output power at a second target value.

9. The multi-loop error amplifier circuit as claimed in claim 8, wherein the first parameter corresponds to the voltage of the output power, and/or the second parameter corresponds to the current of the output power.

10. A multi-loop power converter, comprising:

a multi-loop error amplifier circuit configured to generate an error amplification signal;

a power stage circuit configured to convert an input power to an output power according to the error amplification signal;

a first feedback circuit configured to generate a first feedback signal according to a first parameter related to the output power; and a second feedback circuit configured to generate a second feedback signal according to a second parameter related to the output power;

wherein the multi-loop error amplifier circuit includes:

a first transconductance amplifier comprising a first current output stage, the first current output stage being configure to generate a first transconductance amplification current in a predetermined current direction according to a first voltage difference between a positive input terminal and a negative input terminal of the first transconductance amplifier, wherein the first transconductance amplification current is proportional to the first voltage difference; and a second transconductance amplifier comprising a second current output stage, the second current output stage being configure to generate a second transconductance amplification current in the predetermined current direction according to a second voltage difference between a positive input terminal and negative input terminal of the second transconductance a amplifier, wherein the second transconductance amplification current is proportional to the second voltage difference;

wherein the first current output stage is in series connection with the second current output stage to generate a first error output current, whereby the error amplification signal is generated in accordance with the first error output current, wherein the first error output current is equal to a smaller one of the first transconductance amplification current and the second transconductance amplification current;

wherein the first transconductance amplifier receives the first feedback signal at the positive input terminal or the negative input terminal of the first transconductance amplifier and the second transconductance amplifier receives the second feedback signal at the positive input terminal or the negative input terminal of the second transconductance amplifier, wherein the error amplifier circuit generates the error amplification signal in accordance with the first feedback signal and the second feedback signal, thereby regulating or clamping the first parameter related to the output power at a first target value, and/or regulating or clamping the second parameter related to the output power at a second target value;

wherein the first current output stage includes a first output transistor, and the second current output stage includes a second output transistor, wherein the first output transistor and the second output transistor are MOSFETS (Metal-Oxide-Semiconductor Field Effect Transistors) of the same conductivity type, wherein the first output transistor and the second output transistor are configured to generate the first transconductance amplification current and the second transconductance amplification current according to the first voltage difference and the second voltage difference, respectively, wherein the first output transistor is connected in series with the second output transistor to generate the first error output current;

wherein, when the first transconductance amplification current is smaller than the second transconductance amplification current, the first output transistor outputs the first transconductance amplification current as the first error output current, and clamps the current of the second output transistor to the first transconductance amplification current;

wherein, when the second transconductance amplification current is smaller than the first transconductance amplification current, the second output transistor outputs the second transconductance amplification current as the first error output current and clamps the current of the first output transistor to the second transconductance amplification current;

wherein the first current output stage and the second current output stage are further configured as one of the following:

(1) the first current output stage further includes a first current mirror, the first current mirror including the first output transistor, wherein the first output transistor mirrors a first pre-transconductance current to generate the first transconductance amplification current, and/or, the second current output stage further includes a second current mirror, the second current mirror including the second output transistor, wherein the second output transistor mirrors a second pre-transconductance current to generate the second transconductance amplification current, wherein the first pre-transconductance current is proportional to a product of the first voltage difference and a predetermined first transconductance value, and the second pre-transconductance current is proportional to a product of the second voltage difference and a predetermined second transconductance value; or (2) the first current output stage further includes a third output transistor, and the second current output stage further includes a fourth output transistor, wherein the third output transistor and the first output transistor are MOS transistors of complementary conductivity types, and the fourth output transistor and the second output transistor are MOS transistors of complementary conductivity types;

wherein the first output transistor and the third output transistor are configured to generate the first transconductance amplification current in push-pull manner according to the first voltage difference, and the second output transistor and the fourth output transistor are configured to generate the second transconductance amplification current in push-pull manner according to the second voltage difference;

wherein the third output transistor is coupled in parallel with the fourth output transistor, thereby generating the first error output current in push-pull manner.

11. The multi-loop power converter as claimed in claim 10, wherein when the first current output stage and the second current output stage are further configured as (1), the first current output stage further includes a cascode transistor which is coupled to the second current mirror to assist matching of the transistors of the second current mirror, so as to ensure a mirror accuracy of the second current mirror.

12. The multi-loop power converter as claimed in claim 10, wherein when the first transconductance amplification current is smaller than the second transconductance amplification current, the first output transistor operates in a saturation region and the second output transistor operates in a linear region;

wherein when the second transconductance amplification current is smaller than the first transconductance amplification current, the second output transistor operates in a saturation region and the first output transistor operates in a linear region.

13. The multi-loop power converter as claimed in claim 10, further comprising:

a third current mirror for mirroring the first error output current to generate a first comparison current in a current output branch of the third current mirror; and a third transconductance amplifier including a third current output stage, wherein the third current output stage generates a third transconductance amplification current in the predetermined current direction according to a third voltage difference between a positive input terminal and a negative input terminal of the third transconductance amplifier, wherein the third transconductance amplification current is proportional to the third voltage difference;

wherein the current output branch of the third current mirror is connected in series with another current output branch to generate a gross output current, wherein the other current output branch is configured to generate a second comparison current according to the third transconductance amplification current;

wherein when the first comparison current is smaller than the second comparison current, the current output branch of the third current mirror generates the first comparison current as the gross output current and clamps the current of the other current output branch at the first comparison current;

wherein when the second comparison current is smaller than the first comparison current, the other current output branch generates the second comparison current as the gross output current and clamp the current generated by the third current mirror to the second comparison current;

wherein the gross output current is equal to a smallest one of the first transconductance amplification current, the second transconductance amplification current, and the second comparison current;

wherein the error amplification signal is generated according to the gross output current.

14. The multi-loop power converter according to claim 13, further comprising:

a fourth transconductance amplifier including a fourth current output stage, wherein the fourth current output stage generates a fourth transconductance amplification current in the predetermined current direction according to a fourth voltage difference between a positive input terminal and a negative input terminal of the fourth transconductance amplifier, wherein the fourth transconductance amplification current is proportional to the fourth voltage difference;

wherein the third current output stage is connected in series with the fourth current output stage to generate a second error output current, wherein the second error output current is equal to a smaller one of the third transconductance amplification current and the fourth transconductance amplification current; and a fourth current mirror for mirroring the second error output current to generate the second comparison current in the other current output branch;

wherein when the first comparison current is smaller than the second comparison current, output branch of the third current mirror generates the first comparison current as the gross output current and clamps the current generated by the fourth current mirror at the first comparison current;

wherein when the second comparison current is smaller than the first comparison current, the other current output branch of the fourth current mirror generates the second comparison current as the gross output current and clamp the current generated by the third current mirror to the second comparison current;

wherein the gross output current is equal to a smallest one of the first transconductance amplification current, the second transconductance amplification current, the third and the fourth transconductance amplification current transconductance amplification current.

15. The multi-loop power converter as claimed in claim 10, wherein when the first current output stage and the second current output stage are further configured as (2), the first transconductance amplifier further includes a first preamplifier, wherein an output terminal of the first preamplifier is coupled to the first current output stage, wherein the first preamplifier is configured to generate a first pre-amplification signal at the output terminal of the first preamplifier according to the first voltage difference, and wherein the first output transistor is configured to generate the first transconductance amplification current according to the first pre-amplification signal; and wherein the second transconductance amplifier further includes a second preamplifier, wherein an output terminal of the second preamplifier is coupled to the second current output stage, wherein the second preamplifier is configured to generate a second pre-amplification signal at the output terminal of the second preamplifier according to the second voltage difference, and wherein the second output transistor is configured to generate the second transconductance amplification current according to the second pre-amplification signal.

16. The multi-loop power converter as claimed in claim 10, wherein when the first current output stage and the second current output stage are further configured as (1), the first transconductance amplifier further includes a first preamplifier, wherein the first preamplifier is configured to generate the first pre-transconductance current at an output terminal of the first preamplifier according to the first voltage difference; and wherein the second transconductance amplifier further includes a second preamplifier, wherein the second preamplifier is configured to generate the second pre-transconductance current at an output terminal of the second preamplifier according to the second voltage difference.

17. The multi-loop power converter as claimed in claim 10, wherein the first parameter corresponds to the voltage of the output power, and/or the second parameter corresponds to the current of the output power.

18. A method for controlling a multi-loop power converter to generate an output power, comprising:
generating a first error amplification current in a first current output branch according to a first difference between a first parameter related to the output power and a first target value, wherein the first error amplification current is proportional to the first difference;
generating a second error amplification current in a second current output branch according to a second difference between a second parameter related to the output power and a second target value, wherein the second error amplification current is proportional to the second difference;
connecting the first current output branch and the second current output branch in series, so that the first error amplification current generated by the first current output branch and the second error amplification current generated by the second current output branch clamp each other to generate a first error output current, to thereby generate an error amplification signal, wherein the first error output current is equal to a smaller one of the first error amplification current and the second error amplification current; and
regulating or clamping the first parameter related to the output power at the first target value according to the error amplification signal, and/or regulating or clamping the second parameter related to the output power at the second target value;

wherein the step of generating the first error amplification current and the second error amplification current further includes one of the following:
(1) mirroring a first pre-transconductance current to generate the first error amplification current; and
mirroring a second pre-transconductance current to generate the second error amplification current;
wherein the first pre-transconductance current is proportional to the product of the first difference and a predetermined first transconductance value, and the second pre-transconductance current is proportional to the product of the second difference and a predetermined second transconductance value; or
(2) generating the first error amplification current in push-pull manner according to the first difference; and
generating the second error amplification current in push-pull manner according to the second difference.

19. The method for controlling a multi-loop power converter to generate an output power as claimed in claim 18, wherein the first parameter corresponds to the voltage of the output power, and/or the second parameter corresponds to the current of the output power.

20. A multi-loop error amplifier circuit configured to generate an error amplification signal, the multi-loop error amplifier circuit comprising:
a first transconductance amplifier comprising a first current output stage, the first current output stage being configure to generate a first transconductance amplification current in a predetermined current direction according to a first voltage difference between a positive input terminal and a negative input terminal of the first transconductance amplifier, wherein the first transconductance amplification current is proportional to the first voltage difference; and
a second transconductance comprising a second current output stage, the second current output stage being configure to generate a second transconductance amplification current in the predetermined current direction according to a second voltage difference between a positive input terminal and a negative input terminal the of second transconductance amplifier, wherein the second transconductance amplification current is proportional to the second voltage difference;
wherein the first current output stage is in series connection with the second current output stage to generate a first error output current, whereby the error amplification signal is generated in accordance with the first error output current, wherein the first error output current is equal to a smaller one of the first transconductance amplification current and the second transconductance amplification current;
wherein the multi-loop error amplifier circuit further comprising:
a current mirror for mirroring the first error output current to generate a first comparison current in a current output branch of the current mirror; and
a third transconductance amplifier including a third current output stage, wherein the third current output stage generates a third transconductance amplification current in the predetermined current direction according to a third voltage difference between a positive input terminal and a negative input terminal of the third transconductance amplifier, wherein the third transconductance amplification current is proportional to the third voltage difference;
wherein the current output branch of the current mirror is connected in series with another current output branch to generate a gross output current, wherein the other current output branch is configured to generate a second comparison current according to the third transconductance amplification current;

wherein when the first comparison current is smaller than the second comparison current, the current output branch of the current mirror generates the first comparison current as the gross output current and clamps the current of the other current output branch at the first comparison current;

wherein when the second comparison current is smaller than the first comparison current, the other current output branch generates the second comparison current as the gross output current and clamp the current generated by the current mirror to the second comparison current;

wherein the gross output current is equal to a smallest one of the first transconductance amplification current, the second transconductance amplification current, and the second comparison current;

wherein the error amplification signal is generated according to the gross output current.

* * * * *